(12) United States Patent
Wolfshagen et al.

(10) Patent No.: US 12,273,643 B1
(45) Date of Patent: Apr. 8, 2025

(54) ADAPTIVE, HIGH SPEED OPTICAL DIGITAL SENSOR CHIP ASSEMBLY FOR TEMPORAL SENSING APPLICATIONS

(71) Applicant: Oceanit Laboratories, Inc., Honolulu, HI (US)

(72) Inventors: Randy Wolfshagen, Kekaha, HI (US); Andy Crahan, Hanapepe, HI (US)

(73) Assignee: Oceanit Laboratories, Inc., Honolulu, HI (US)

( * ) Notice: Subject to any disclaimer, the term of this patent is extended or adjusted under 35 U.S.C. 154(b) by 465 days.

(21) Appl. No.: 17/592,283

(22) Filed: Feb. 3, 2022

Related U.S. Application Data

(60) Provisional application No. 63/145,309, filed on Feb. 3, 2021.

(51) Int. Cl.
| | | |
|---|---|---|
| *H04N 25/772* | (2023.01) | |
| *H04N 25/75* | (2023.01) | |
| *H10F 39/18* | (2025.01) | |

(52) U.S. Cl.
CPC ........... *H04N 25/772* (2023.01); *H04N 25/75* (2023.01); *H10F 39/18* (2025.01)

(58) Field of Classification Search
CPC .................. H04N 25/75; H04N 25/772; H01L 27/14643
See application file for complete search history.

(56) References Cited

U.S. PATENT DOCUMENTS

| | | | |
|---|---|---|---|
| 7,333,181 B1 | 2/2008 | Scott et al. | |
| 2013/0187028 A1* | 7/2013 | Salvestrini | H04N 23/11 |
| | | | 250/208.1 |
| 2019/0260384 A1* | 8/2019 | Liobe | H04N 25/78 |
| 2021/0037201 A1* | 2/2021 | Tantawy | H04N 25/78 |
| 2021/0333154 A1* | 10/2021 | Uyeno | G01J 5/061 |

\* cited by examiner

*Primary Examiner* — Thanh Luu

(74) *Attorney, Agent, or Firm* — Fresh IP PLC; Clifford D. Hyra; Aubrey Y. Chen

(57) ABSTRACT

The disclosure relates to optical sensing for both near and far field imaging at different speeds. In particular, disclosed herein is a novel adaptive, high speed optical digital Sensor Chip Assembly (SCA) that can be used in a variety of sensing applications. Specifically disclosed is an optical sensor, referred to herein as the "Oceanit Digital Sensor," which comprises a SCA. This SCA includes a focal plane array (FPA) connected, or "hybridized," to a digital read out integrated circuit (DROIC) through various micro-connections, thereby resulting in a multi-layered assembly. The FPA is a light sensitive layer that converts incoming photons of light to electronic charges, which the DROIC then collects, processes, and converts into a digital output stream. The DROIC includes a matching array of charge-to-voltage integrating amplifiers, as well as other circuits, to support the conversion of the light received on the FPA into a representative data stream.

28 Claims, 3 Drawing Sheets

ADAPTIVE, HIGH SPEED OPTICAL DIGITAL SENSOR CHIP ASSEMBLY FOR TEMPORAL SENSING APPLICATIONS

CROSS-REFERENCE TO RELATED APPLICATIONS

This application claims the benefit of U.S. Provisional Application No. 63/145,309, filed Feb. 3, 2021, which is incorporated by reference herein in its entirety.

STATEMENT REGARDING FEDERALLY SPONSORED RESEARCH OR DEVELOPMENT

This invention was supported in part by the U.S. government ("Government") under Contract N68335-16-G-0028 with the Naval Air Warfare Center Aircraft Division. The Government therefore has certain rights in the invention.

FIELD OF THE INVENTION

The application relates generally to optical sensing for both near and far field imaging at different speeds. In particular, the application relates to a novel adaptive, high speed optical digital focal plane array that can be used in a variety of sensing applications.

BACKGROUND

Optical sensing is used in a variety of different fields, including, but not limited to, ground-based, sea-based, space-based, and airborne optical remote sensing, commercial thermal and visible sensing in industrial applications, and medical sensing for diagnoses and observation.

Current state-of-the-art technology utilizes multiple sensors in order to sense object(s) in the relevant field of view, detect any object(s) of importance, create one or more images, and characterize those detected objects and their surroundings.

Additionally, some current optical sensing technology utilizes a digital pixel sensor chip assembly (DPSCA) in which the analog to digital conversion of the image and the electron counter is in-pixel. Such an approach can be problematic due to manufacturing yields and circuit element uniformities resulting in material performance non-uniformities in the microcircuits in each pixel unit cell.

Moreover, although relatively small, fast-framing sensor chip assemblies (SCAs) exist, including, for instance, the SCA disclosed in U.S. Pat. No. 7,333,181 B1 ("MOST Patent"), none exists that accommodates a mega-pixel format. Similarly, although relatively sensitive mega-pixel SCAs exist, such as, for example, the forward looking infrared (FLIR) ISC0802 mid-wave infrared (MWIR) SCA, none exists that has the fast, multi-mode switching capabilities described herein.

Given the foregoing, there exists a significant need for novel optical sensing technology and sensor chip assemblies that can be used in temporal sensing applications.

SUMMARY

It is to be understood that both the following summary and the detailed description are exemplary and explanatory and are intended to provide further explanation of the invention as claimed. Neither the summary nor the description that follows is intended to define or limit the scope of the invention to the particular features mentioned in the summary or in the description.

In general, the present invention is directed towards optical sensing for both near and far field imaging at different speeds. In particular, the application relates to a novel adaptive, high speed optical digital SCA that can be used in a variety of sensing applications.

At least one embodiment of the invention comprises an optical sensor, referred to herein as the "Oceanit Digital Sensor," which comprises a Sensor Chip Assembly (SCA). This SCA comprises a focal plane array (FPA) connected, or "hybridized," to a digital read out integrated circuit (DROIC) through numerous micro-connections, thereby resulting in a multi-layered assembly.

A skilled artisan will appreciate that the FPA is a light sensitive layer that converts incoming photons of light to electronic charges (i.e., electrons that are excited due to a reaction with the light photons), which the DROIC then collects, processes, and converts into a digital output stream. Further, the DROIC may comprise a matching array of charge-to-voltage integrating amplifiers, as well as other circuits, to support the conversion of the light received on the FPA into a representative data stream.

These and further and other objects and features of the invention are apparent in the disclosure, which includes the above and ongoing written specification, as well as the drawings.

BRIEF DESCRIPTION OF THE DRAWINGS

The accompanying drawings, which are incorporated herein and form a part of the specification, illustrate exemplary embodiments and, together with the description, further serve to enable a person skilled in the pertinent art to make and use these embodiments and others that will be apparent to those skilled in the art. The invention will be more particularly described in conjunction with the following drawings wherein.

DETAILED DESCRIPTION

Figure 1:
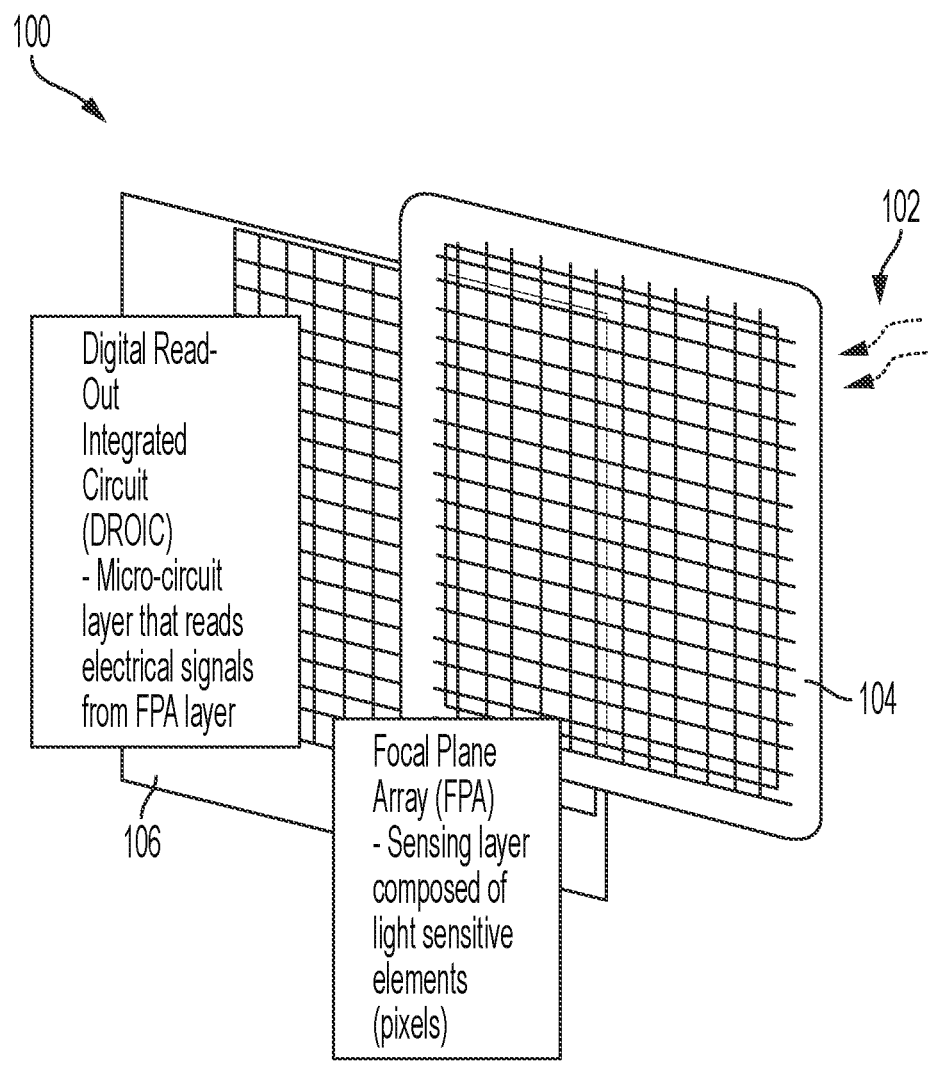
FIG. 1 is a depiction of an Oceanit Digital Sensor (i.e., an SCA with an FPA and its companion DROIC), according to at least one embodiment of the present disclosure.

The present invention is more fully described below with reference to the accompanying figures. The following description is exemplary in that several embodiments are described (e.g., by use of the terms "preferably," "for example," or "in one embodiment"); however, such should not be viewed as limiting or as setting forth the only embodiments of the present invention, as the invention encompasses other embodiments not specifically recited in this description, including alternatives, modifications, and equivalents within the spirit and scope of the invention. Further, the use of the terms "invention," "present invention," "embodiment," and similar terms throughout the description are used broadly and not intended to mean that the invention requires, or is limited to, any particular aspect being described or that such description is the only manner in which the invention may be made or used. Additionally, the invention may be described in the context of specific applications; however, the invention may be used in a variety of applications not specifically described.

The embodiment(s) described, and references in the specification to "one embodiment", "an embodiment", "an example embodiment", etc., indicate that the embodiment(s) described may include a particular feature, structure, or characteristic. Such phrases are not necessarily referring to the same embodiment. When a particular feature, structure, or characteristic is described in connection with an embodiment, persons skilled in the art may effect such feature, structure, or characteristic in connection with other embodiments whether or not explicitly described.

In the several figures, like reference numerals may be used for like elements having like functions even in different drawings. The embodiments described, and their detailed construction and elements, are merely provided to assist in a comprehensive understanding of the invention. Thus, it is apparent that the present invention can be carried out in a variety of ways, and does not require any of the specific features described herein. Also, well-known functions or constructions are not described in detail since they would obscure the invention with unnecessary detail. Any signal arrows in the drawings/figures should be considered only as exemplary, and not limiting, unless otherwise specifically noted. Further, the description is not to be taken in a limiting sense, but is made merely for the purpose of illustrating the general principles of the invention, since the scope of the invention is best defined by the appended claims.

It will be understood that, although the terms first, second, etc. may be used herein to describe various elements, these elements should not be limited by these terms. These terms are only used to distinguish one element from another. Purely as a non-limiting example, a first element could be termed a second element, and, similarly, a second element could be termed a first element, without departing from the scope of example embodiments. As used herein, the term "and/or" includes any and all combinations of one or more of the associated listed items. As used herein, "at least one of A, B, and C" indicates A or B or C or any combination thereof. As used herein, the singular forms "a", "an," and "the" are intended to include the plural forms as well, unless the context clearly indicates otherwise. It should also be noted that, in some alternative implementations, the functions and/or acts noted may occur out of the order as represented in at least one of the several figures. Purely as a non-limiting example, two figures shown in succession may in fact be executed substantially concurrently or may sometimes be executed in the reverse order, depending upon the functionality and/or acts described or depicted.

As used herein, ranges are used herein in shorthand, so as to avoid having to list and describe each and every value within the range. Any appropriate value within the range can be selected, where appropriate, as the upper value, lower value, or the terminus of the range.

Unless indicated to the contrary, numerical parameters set forth herein are approximations that can vary depending upon the desired properties sought to be obtained. At the very least, and not as an attempt to limit the application of the doctrine of equivalents to the scope of any claims, each numerical parameter should be construed in light of the number of significant digits and ordinary rounding approaches.

The words "comprise", "comprises", and "comprising" are to be interpreted inclusively rather than exclusively. Likewise the terms "include", "including" and "or" should all be construed to be inclusive, unless such a construction is clearly prohibited from the context. The terms "comprising" or "including" are intended to include embodiments encompassed by the terms "consisting essentially of" and "consisting of". Similarly, the term "consisting essentially of" is intended to include embodiments encompassed by the term "consisting of". Although having distinct meanings, the terms "comprising", "having", "containing" and "consisting of" may be replaced with one another throughout the description of the invention.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

"Typically" or "optionally" means that the subsequently described event or circumstance may or may not occur, and that the description includes instances where said event or circumstance occurs and instances where it does not.

Wherever the phrase "for example," "such as," "including" and the like are used herein, the phrase "and without limitation" is understood to follow unless explicitly stated otherwise.

In general, the word "instructions," as used herein, refers to logic embodied in hardware or firmware, or to a collection of software units, possibly having entry and exit points, written in a programming language, such as, but not limited to, Python, R, Rust, Go, SWIFT, Objective C, Java, JavaScript, Lua, C, C++, or C #. A software unit may be compiled and linked into an executable program, installed in a dynamic link library, or may be written in an interpreted programming language such as, but not limited to, Python, R, Ruby, JavaScript, or Perl. It will be appreciated that software units may be callable from other units or from themselves, and/or may be invoked in response to detected events or interrupts. Software units configured for execution on computing devices by their hardware processor(s) may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. Generally, the instructions described herein refer to logical modules that may be combined with other modules or divided into sub-modules despite their physical organization or storage. As used herein, the term "computer" is used in accordance with the full breadth of the term as understood by persons of ordinary skill in the art and includes, without limitation, desktop computers, laptop computers, tablets, servers, mainframe computers, smartphones, handheld computing devices, and the like.

In this disclosure, references are made to users performing certain steps or carrying out certain actions with their client computing devices/platforms. In general, such users and their computing devices are conceptually interchangeable. Therefore, it is to be understood that where an action is shown or described as being performed by a user, in various implementations and/or circumstances the action may be performed entirely by the user's computing device or by the user, using their computing device to a greater or lesser extent (e.g. a user may type out a response or input an action, or may choose from preselected responses or actions generated by the computing device). Similarly, where an action is shown or described as being carried out by a computing device, the action may be performed autonomously by that computing device or with more or less user input, in various circumstances and implementations.

In this disclosure, various implementations of a computer system architecture are possible, including, for instance, thin client (computing device for display and data entry) with fat server (cloud for app software, processing, and database), fat client (app software, processing, and display) with thin server (database), edge-fog-cloud computing, and other possible architectural implementations known in the art.

Generally, embodiments of the present disclosure are directed towards optical sensing for both near and far field imaging, object detection and characterization at temporal frequencies. In particular, the application relates to a novel adaptive, high speed optical digital SCA that can be used in a variety of sensing applications. At least some of these sensing applications comprise the novel adaptive, high speed optical digital SCA coupled with an imaging system (such as, for instance, a lens or telescope) and a high-speed data acquisition and/or processing system. The SCA may be housed in a cryogenic dewar to provide the cryogenic operating temperature required by the mating detector array.

At least one embodiment of the disclosure comprises an optical sensing component, shown in FIG. 1, which comprises a focal plane array (FPA) and a digital read out integrated circuit (DROIC). The FPA is a light sensitive layer that converts incoming photons of light to electronic charges, which the DROIC then collects, processes, and converts into a digital output stream.

In various embodiments of the disclosure, the FPA comprises an array of photovoltaic diodes. Each diode has a mating DROIC circuitry, which together is called a "pixel." It should be appreciated that the FPA may be made from different semiconductor materials depending on the desired wavelength response, i.e., the wavelength(s) of light that a user wishes to capture and/or sense. Such semiconductor materials are well-known in the art.

In embodiments of the present disclosure, the DROIC comprises, as part of its pixel array and unit cells, a matching array of charge-to-voltage integrating amplifiers. The DROIC further comprises other circuits, which may number over 20 other circuits, to support the conversion of the light received on the FPA into a representative data stream. The DROIC may be made from complementary metal-oxide semiconductor (CMOS) chips.

It should be appreciated that the FPA is connected, or "hybridized," to the DROIC through many micro-connections (e.g., over one million connections), thereby resulting in a multi-layered assembly. Such micro-connections are well-known in the art, including, for instance, indium bump technology. This FPA-DROIC assembly is called a Sensor Chip Assembly (SCA).

Turning now to FIG. 1, an exemplary non-limiting SCA 100, which will be referred to herein as the "Oceanit Digital Sensor," is shown. One or more desired wavelengths of light 102 are detected by the FPA 104, which is a sensing layer composed of light sensitive diodes. The FPA 104 is connected to the DROIC 106, which is a micro-circuit layer that reads the electrical signals sent from the FPA.

Thus, the Oceanit Digital Sensor 100 comprises an FPA 104 and its companion DROIC 106. The CMOS DROIC in the Oceanit Digital Sensor is designed to be interoperable with any PonN-based photovoltaic focal plane architecture operating in the visible (VIS), short wave infrared (SWIR), mid-wave infrared (MWIR), or long-wave infrared (LWIR) bands. In other words, the DROIC of the Oceanit Digital Sensor is operable with FPAs utilizing different photodiode technologies made from different semiconductor materials and architectures, enabling performance at different operating temperatures and over different wave bands. Specifically, the Oceanit Digital Sensor is capable of sensing wavelengths in all of the aforementioned spectral ranges.

The Oceanit Digital Sensor's DROIC is designed to provide the capability for very high speed optical sensing with frame rates of 2.5 kilohertz at full frame, as well as full resolution and higher frame rates for windowed frames that have a smaller pixel area. Specifically, the DROIC comprises a plurality of specialized subcircuits, each with one or more different features, combined together to support and/or enable high speed sensing.

Figure 2:
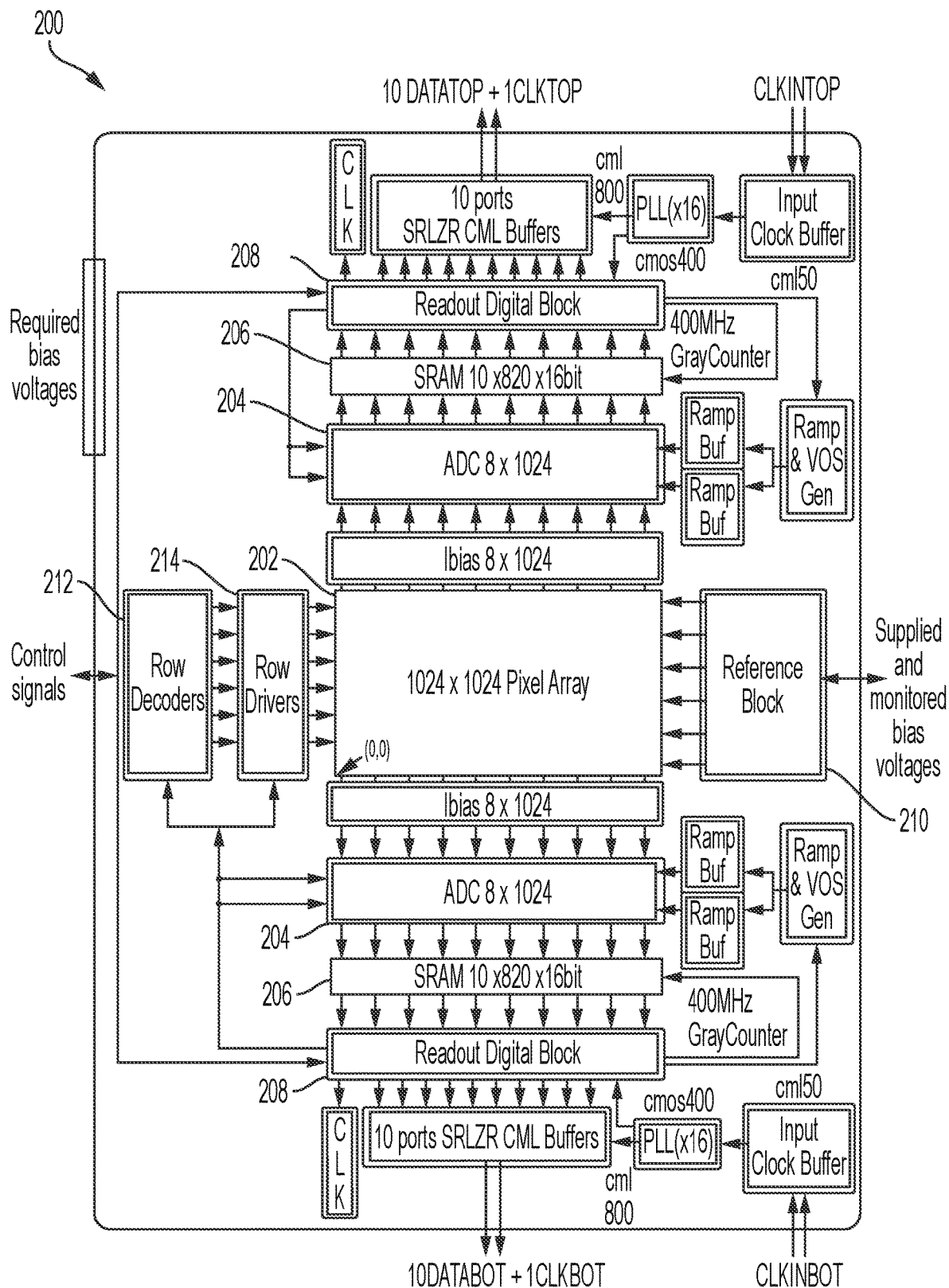
FIG. 2 is a DROIC architecture block diagram for an Oceanit Digital Sensor, according to at least one embodiment of the present disclosure.

Turning now to FIG. 2, an exemplary non-limiting DROIC architecture block diagram$_{[Ac1]}$ for the Oceanit Digital Sensor is shown. The DROIC is designed with a unique feature set, including, but not limited to, (1) 2.5 khz megapixel (1024×1024 pixel) full frame rate (12 bit); (2) 200 hz megapixel (1024×1024 pixel) full frame rate (16 bit); (3) 50 khz independent window rate (12 bit) with up to 5 windows simultaneously; (4) pixel-level auto-detection in DROIC hardware; (5) Signal-to-Noise (SNR) gain through in-pixel over-sampling and minimization of pixel reset time; (6) frame stamping in hardware to simplify the networking of multiple sensors, including, but not limited to, multiple Oceanit Digital Sensors; and (7) high speed mode switching in hardware (i.e., the mode can be switched in one frame or less).

As shown in FIG. 2, the DROIC 200 comprises at least the following modules: (1) a pixel array 202; (2) analog-to-digital converters (ADC) 204; (3) static random access memory (SRAM) 206; (4) readout digital blocks 208; (5) reference block 210; (6) row decoders 212; and (7) row drivers 214. The ADC is not located in-pixel but instead at the edge of the DROIC in a "sidecar" configuration. As can be seen, the ADC 204 are physically located at a distance adjacent to the pixel array on DROIC 200. Generally, the circuitry of DROIC pixel array 202 is complementary with, and located directly below, the FPA pixels 104. That is, "below" means that the pixel array 202 is located adjacent to a side of the FPA pixels 104 that is located opposite a side of the FPA pixels that contacts light photons.

One of skill in the art will appreciate that the Oceanit Digital Sensor is capable of fast frame speeds, as mentioned above, and further that these frame speeds are improvements on the current state of the art. Current technology includes optical sensors in cameras such as the FUR X6900sc, which offers full frame speeds up to 1 khz, but at a relatively low resolution of 640×512 pixels. Moreover, the current technology is limited by the rate of video data that can be streamed off the read out integrated chip (ROIC) (i.e., between 2-3 gigabits per second).

The above is in contrast with the Oceanit Digital Sensor, which achieves high frame rates, such as, for instance, 2.5 khz megapixel (1024×1024 pixel) full frame rate (12 bit), by utilizing 20 channels each operating at 1.6 gigabits per second. This cumulatively results in 32 gigabits per second 12-bit data streaming for a full frame rate of 2.5 khz. Five 16-pixel tall windows can therefore be read out as fast as 50 khz.

The Oceanit Digital Sensor is also capable of running at 200 hz full frame when very fast frame video rates are not required. This slower, but still fast, video stream allows the Oceanit Digital Sensor to use less power and achieve better sensitivity, utilizing 16 bits/pixel.

Figure 3:
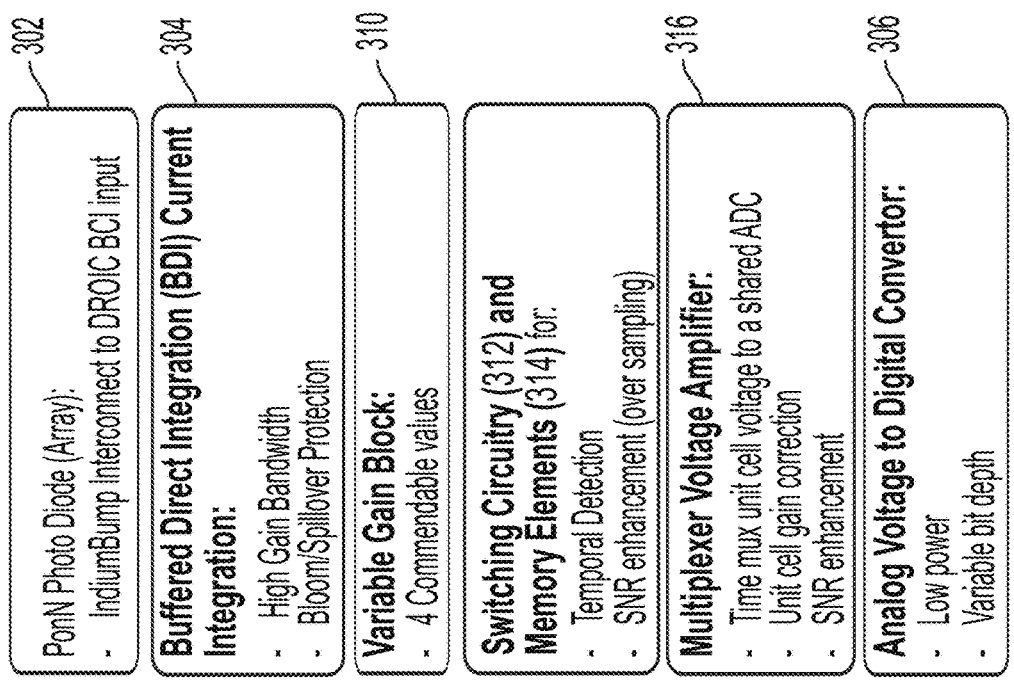
FIG. 3 is a block diagram of a DROIC unit cell, showing the signal chain from the detector array through to the ADC for an Oceanit Digital Sensor, according to at least one embodiment of the present disclosure.
Figure 3:
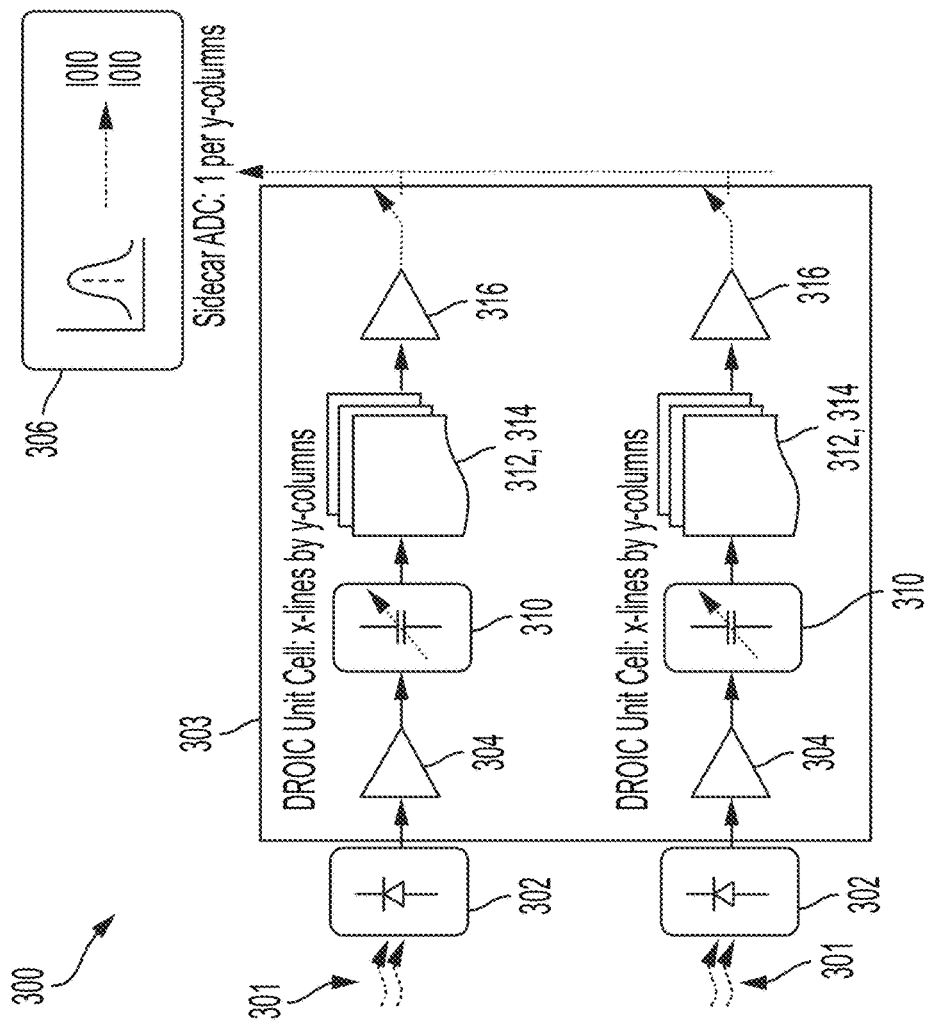

Turning now to FIG. 3, a block diagram of a DROIC unit cell, showing a signal chain 300 from the detector array through to the ADC for an Oceanit Digital Sensor, is shown. Circuitry of the DROIC comprises DROIC unit cells, which are arrayed directly below the FPA pixel array 302. Incoming light 301 is first detected by the FPA 302. Then, the DROIC unit cells 303, located underneath the FPA, integrates and converts the accumulated photocurrent in each pixel of the imaging array to a corresponding voltage. In other words, the DROIC unit cells 303 are located adjacent to a side of the FPA pixel array 302 that is located opposite a side of the FPA pixel array that detects the incoming light 301. Additionally, as stated previously herein, the analog-to-digital converters (ADC) 306 are not located in-pixel but instead at the edge of the DROIC in a "sidecar" configuration 204, 306. The DROIC further comprises a buffered direct integration (BDI) current integrator 304, which enables high gain bandwidth and bloom/spillover protection; a variable gain block 310 with four commandable values; switching circuitry 312 and memory elements 314 for enabling temporal detection and SNR oversampling; a multiplexer voltage amplifier 316 for DROIC unit cell gain correction and SNR enhancement; and an analog voltage-to-digital converter 306 that enables variable bit depth.

In at least one embodiment, the DROIC unit cells comprise capacitors of minimum uniform size for the CMOS node that allows adequate pixel well depth (from 250 k to 8,500 k e−) and provides high dynamic range (from 4,500 to 5,000) when coupled with high speed multiplexing of digitized signals. Other circuitry, including, for instance, the switching circuitry 312 and memory elements 314, is provided in the unit cell to enable in-pixel averaging and change detection.

As mentioned previously herein, and with particular reference to FIG. 3, the Oceanit Digital Sensor enables SNR gain through in-pixel over-sampling and minimization of pixel reset time. In particular, the Oceanit Digital Sensor incorporates SNR enhancement techniques not commonly found in the state-of-the-art technology, and not previously implemented for a high frame rate mega-pixel format sensor. The SNR enhancement is achieved by maximizing the gain of the DROIC pixel integrating amplifiers by using the smallest available uniform integration capacitors for this CMOS node and oversampling the resulting integrated voltage. One of skill in the art will recognize that gain is inversely proportional to integration capacitor size; accordingly, using the smallest available capacitor size results in maximizing gain. This allows for minimization of the non-integrating reset time without saturation of the integration amplifier. The oversampling effectively extends the integration time by the number of over samples taken during a frame readout time. For optical sensors whose performance is background limited by scene irradiance, Signal to Noise Ratio (SNR) increases quadratically with time integrating signal and background photo currents. Hence the DROIC in the Oceanit Digital Sensor effectively improves the SNR by the number of oversamples in a given frame time as compared to less advanced SCAs.

It should be appreciated that prior art that discloses comparable mega-pixel architectures are unable to utilize the entire frame time for integration, which negatively impacts SNR because less time is spent integrating signal.

For example, a less advanced MWIR SCA utilizing the same minimum integration capacitor might be able to integrate for 500 μsec before saturating. Its fastest available frame rate might be as high as 100 Hz. That infers an integration efficiency of just 5%. In contrast, the Oceanit Digital Sensor with the same performance defining components (capacitors and amplifiers) would be able to over sample 20 times in that same 100 Hz frame, resulting in an SNR improvement of greater than 4× (4.47=sqrt(1/100 Hz/500 μsec)) with an integration efficiency of close to 100%. In addition to this material SNR improvement over less advanced SCAs, there is little to no chance that any fleetingly brief events would be missed (signal not integrated), whereas the possibility of missing such an event with the less advanced SCA is quite high.

As mentioned previously herein, the Oceanit Digital Sensor comprises pixel-level auto-detection in DROIC hardware. This pixel-level auto-detection comprises, for instance, pixel-level temporal detection against recent values or a running average, pixel-level rise/fall intensity detection, and a full-frame detection state that can be read out in just 100 psec.

This temporal comparison mode is accomplished at the pixel level using the memory elements 312 and switching matrix 314 in the DROIC unit cell, and changes to settings in the sidecar ADC 306. The result is a 2 bit/pixel "changed" frame that can be burst to a small field-programmable gate array (FPGA) located next to the Oceanit Digital Sensor in just 100 μsec. Now the state of change for the entire mega pixel SCA is represented by only 2 bits (for instance, using "00" to represent a dimmer change, using "01" or "10" to represent no change, and using "11" to represent a brighter change.) It should further be appreciated that the sensitivity of this comparison is also fully adjustable.

As a non-limiting example, the sensor could be in its more sensitive 16-bit mode and take a 'snapshot' of the current scene. This snapshot is stored in the unit cell memory elements 314. The sensor is then commanded to 2-bit autodetect mode. The following frame(s) then utilize the unit cell and ADC circuitry to compare the snapshot value to the "live" frame values on a pixel basis. The resulting comparison is digitized into a 2-bit value, and the current frame's 2-bit change values are burst (100 usec) read out to the nearby FPGA based acquisition system. Such 2-bit data frames can be interrogated in real time with a modest acquisition FPGA to simply determine which pixels in the frames represent areas of the scene that are changing (either a 00 or 11 value). This information can be coupled back into the DROIC to change modes quickly (e.g., within one frame time) to, for instance, window down onto smaller pixel areas to allow for fast interrogation (16- or 12-bit) of 2-bit found "areas of interest"

Processing 2-bit pixels versus 12- or 16-bit pixels greatly accelerates the companion FPGA decision processing. One such decision might be to interrogate only areas around pixels that are changing by commanding the DROIC to change into an appropriate window mode. Since the FPGA is only processing a 2 bit frame, these types of decisions can be implemented in microseconds. The resulting small area interrogations, combined with the previous full frames, allow for a low latency video stream result requiring a much reduced effective system bandwidth, which simplifies any accompanying video processing system and allows for a less expensive system implementation.

Moreover, the aforementioned simplification of data processing frees up power and real estate in the DROIC pixel unit to allow for improved noise and dynamic range-limiting circuit elements.

As mentioned previously herein, the Oceanit Digital Sensor simplifies the networking of multiple sensors with each other. One of skill in the art will recognize that one of the hardest aspects of sensing, and analyzing, a large field of view is maintaining time synchronization between multiple sensors. This problem becomes much harder when the multiple sensors are delivering data at high frame rates. Accordingly, the Oceanit Digital Sensor simplifies data fusion from many sensors by imprinting various meta-data on every frame (i.e., by stamping, using one or more processes known in the art, each frame with enabling metadata), including, for instance, the sensor's operating mode, its integration time, and a frame number (calculated from the last frame number reset). This allows multiple Oceanit Digital Sensors to easily have their individual fields of view aligned in time, thereby simplifying accurate time-stamping of each data frame. One of skill in the art will recognize that timing inaccuracies are the predominant error-producing source for detection and tracking systems.

As mentioned previously herein, the Oceanit Digital Sensor further comprises high speed mode switching in its hardware (i.e., the mode can be switched in one frame or less). The Oceanit Digital Sensor in at least one embodiment operates in several modes, thereby allowing the sensor to perform different functions, including, for instance, detection, imaging, and characterization over a wide range of scene backgrounds and contrasts while maintaining excellent SNR and dynamic range. Such excellent SNR and dynamic range is achieved, as mentioned above herein, by, for example, SNR gain through in-pixel over-sampling and minimization of pixel reset time.

Additionally, the Oceanit Digital Sensor's DROIC utilizes over 1,000 registers to control its operation, with each different mode requiring hundreds of changes. Although this arrangement is typical for modern ROIC designs, the Oceanit Digital Sensor is novel in part because it is able to switch between those hundreds of register settings by writing a single 8-bit word to its command buss. Specifically, the DROIC has multiple default memory "pages" that are pre-populated with all the register settings required for each different mode of operation. Each page can be turned active with a single 8-bit word write. The register changes are implemented before the end of the current frame, allowing for high speed mode switching. This in turn enables rapid multi-modal characterization of a scene before it has time to change, ensuring important events are not missed.

In at least one embodiment, the Oceanit Digital Sensor enables high temporal sampling (specifically, object identification based on a temporal signature); multi-modal sensing; SNR enhancement procedures; and multi-sensor integration. Multi-modal sensing is achieved with both high fidelity (via a 16-bit ADC mode with a slower frame rate of roughly 200 Hz) and medium fidelity (via a 12-bit ADC mode with a higher frame rate of roughly 2,500 Hz). A 12-bit ADC mode with a very fast windowed frame rate, with multiple windows, of roughly 50,000 Hz is also available. The Oceanit Digital sensor further enables detection of temporal changes on the per-pixel level; per-pixel changes are reported (e.g., an increase, no change, or a decrease) and mapped to a 2-bit pixel value. Such temporal change detection comprises a fast (roughly 100 µsec) burst full-frame readout, and is available for both medium and high-fidelity modes. The Oceanit Digital sensor, as mentioned previously herein, has SNR enhancement processing for all modes, including sub-frame averaging, which improves SNR versus traditional single sample per frame time, thereby optimizing integration time efficiency, with integration of the signal at >95% of the frame time. The SNR enhancement processing further minimizes "blind" time (i.e., when the integrator is resetting), which one of skill in the art will recognize is important for brief temporal event detection and characterization. Finally, robust metadata is available for multi-sensor integration, including, for instance, integration of multiple Oceanit Digital Sensors together. Each frame is stamped with, at minimum, the operating mode, the integration time, and the frame number.

At least one of the embodiments disclosed herein, including one or more examples of the Oceanit Digital Sensor, are usable with computer instructions and/or software, which may be used to control one or more functionalities and/or procedures of the sensor that are described above herein.

Based on at least all of the aforementioned properties of the Oceanit Digital Sensor in its various embodiments, it should be appreciated that the Oceanit Digital Sensor improves upon current, state-of-the-art technology for large format optical sensors by combining advanced salient functions into a single sensor that allows for a unique combination of detection, high frame rate imaging, and characterization.

Indeed, while relatively small fast framing SCAs exist in the art (such as, for instance, the SCA disclosed in U.S. Pat. No. 7,333,181 B1 ("MOST Patent"), none exist for a mega pixel format. Similarly, while very sensitive megapixel SCAs exist in the art (such as, for instance, FLIR ISC0802), none of these have the fast switching multi-mode capabilities that the Oceanit Digital Sensor has.

Furthermore, while temporal change detecting SCAs exist in the art (such as, for example, the SCA disclosed in the MOST Patent), none exist that incorporate averaging enhanced SNR to decrease false detections and offer 2-bit change detection with a mega pixel frame detection state burst readout in 100 µsec (in contrast to the Oceanit Digital Sensor, which provides change indication and associated change polarity and in each pixel's 2-bit representation when in this mode).

It should therefore be appreciated that the Oceanit Digital Sensor improves upon the SCA disclosed in the MOST Patent by offering, among other benefits, better sensitivity and spatial resolution. The Oceanit Digital Sensor also has a larger FPA (20.5 mm$^2$) versus the SCA disclosed in the MOST Patent (16 mm$^2$), thereby allowing a larger field of view and/or better angular resolution.

The Oceanit Digital Sensor also comprises improvements upon other SCAs based on digital-pixel focal plane array (DPFA) technology, including, for instance, the DFPA developed by the Lincoln Laboratory at the Massachusetts Institute of Technology (MIT) and the forward looking infrared (FLIR) ISC0802 mid-wave infrared (MWIR) SCA, both of which are known in the art. In particular, a skilled artisan will recognize that the Oceanit Digital Sensor has faster frame rates, lower power dissipation, and simpler calibration as compared to MITs DPFA. Indeed, it is commonly known in the art that digital-pixel ROICs have higher power dissipation/pixel and are materially more difficult to calibrate. The skilled artisan will further recognize that DPFA technology can suffer from inadequate quality control of fabricated micro-circuitry in the DPFA unit cell. These parasitic leakage currents can result in significant non-uniform SCA performance resulting in degraded dynamic range and scene quality. When compared to another advanced ROIC (e.g., FLIR's mega-pixel analog fast framing ISC0802), the Oceanit Digital Sensor provides much higher full (e.g., 2,500 or more vs. 275 Hz) and windowed (e.g., 50,000 or more vs. 4,400 Hz for three 16-pixel tall windows) frame rates, as well as significantly better dynamic range (e.g., 99 or more vs. 78 dB for the same 275 Hz frame rate).

These and other objectives and features of the invention are apparent in the disclosure, which includes the above and ongoing written specification.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated.

The invention is not limited to the particular embodiments illustrated in the drawings and described above in detail. Those skilled in the art will recognize that other arrangements could be devised. The invention encompasses every possible combination of the various features of each embodiment disclosed. One or more of the elements described herein with respect to various embodiments can be implemented in a more separated or integrated manner than explicitly described, or even removed or rendered as inoperable in certain cases, as is useful in accordance with a particular application. While the invention has been described with reference to specific illustrative embodiments, modifications and variations of the invention may be constructed without departing from the spirit and scope of the invention as set forth in the following claims.

We claim:

1. An optical sensor comprising:
   an optical digital sensor chip assembly (SCA), the SCA comprising a focal plane array (FPA) and a digital read out integrated circuit (DROIC);
   wherein the FPA comprises an array of photovoltaic diodes that converts light photons to electronic charges,
   wherein the DROIC receives the electronic charges and converts the electronic charges to a digital output stream,
   wherein the DROIC comprises a plurality of circuitry, the plurality of circuitry comprising a plurality of unit cells located adjacent to a side of the array of photovoltaic diodes that is located opposite a side of the array of photovoltaic diodes that contacts the light photons,
   wherein each diode in the array of photovoltaic diodes is mated to a unit cell in the plurality of unit cells, and
   wherein the DROIC is configured to report temporal changes for each pixel in the array of photovoltaic diodes, wherein the temporal changes comprise an increase, no change, or a decrease.

2. The optical sensor of claim 1, wherein the SCA is coupled with an imaging system.

3. The optical sensor of claim 1, wherein the SCA is housed in a cryogenic dewar.

4. The optical sensor of claim 1, wherein the plurality of circuitry further comprises a matching array of charge-to-voltage integrating amplifiers for the conversion of the electronic charges to the digital output stream.

5. The optical sensor of claim 1, wherein the DROIC is made from complementary metal-oxide semiconductor (CMOS) chips.

6. The optical sensor of claim 1, wherein the FPA is hybridized to the DROIC through a plurality of microconnections.

7. The optical sensor of claim 1, wherein the optical sensor is configured to operate in a spectral range selected from the group consisting of: a visible light range, a short wave infrared range, a mid-wave infrared range, a long-wave infrared range, and combinations thereof.

8. The optical sensor of claim 1, wherein the plurality of circuitry further comprises a plurality of analog-to-digital converters (ADC) arranged at a distance from, and adjacent to, a matching array of charge-to-voltage integrating amplifiers for the conversion of the electronic charges to the digital output stream, a multiplexer voltage amplifier for gain correction, and SNR enhancement for the plurality of unit cells,
   wherein the SNR enhancement comprises in-unit cell over-sampling and minimization of unit cell integrator reset time.

9. The optical sensor of claim 8, wherein the plurality of ADC is configured to operate in one or more modes selected from the group consisting of: a high-fidelity mode comprising processing 16-bit pixels with a frame rate of approximately 200 Hz, a medium-fidelity mode comprising processing 12-bit pixels with a frame rate of approximately 2,500 Hz, a mode comprising processing 12-bit pixels with a windowed frame rate of approximately 50,000 Hz.

10. The optical sensor of claim 1, wherein the DROIC is further configured to map the temporal changes for each pixel to a 2-bit pixel value.

11. The optical sensor of claim 10, wherein the DROIC is configured to burst the 2-bit pixel value is to a field-programmable gate array (FPGA) in 100 μsec.

12. An optical sensor comprising:
    an optical digital sensor chip assembly (SCA), the SCA comprising a focal plane array (FPA) and a digital read out integrated circuit (DROIC);
    wherein the FPA comprises an array of photovoltaic diodes that converts light photons to electronic charges,
    wherein the DROIC receives the electronic charges and converts the electronic charges to a digital output stream,
    wherein the DROIC comprises a pixel array, a plurality of analog-to-digital converters (ADC), a static random access memory (SRAM), a plurality of readout digital blocks, a reference block, a plurality of row decoders, and a plurality of row drivers, and
    wherein the DROIC is configured to perform pixel-level auto-detection comprising pixel-level temporal detection and pixel-level detection of changes in intensity.

13. The optical sensor of claim 12, wherein the plurality of ADC are physically located in a sidecar configuration at a position adjacent to the pixel array, wherein the position is at an edge of the DROIC.

14. The optical sensor of claim 12, wherein circuitry of the pixel array is complementary with the FPA, and located directly adjacent to a side of the FPA that is located opposite a side of the FPA that contacts the light photons.

15. The optical sensor of claim 12, wherein the FPA has a size of at least 20 mm$^2$.

16. The optical sensor of claim 12, wherein the optical sensor has a full-frame rate of at least 2,500 Hz and a windowed frame rate of at least 50,000 Hz for three 16-pixel tall windows, and a dynamic range of at least 99 dB for a 275 Hz frame rate.

17. The optical sensor of claim 12, wherein a plurality of unit cells in the pixel array integrate and convert the photocurrent in each pixel of the array of photovoltaic diodes to a corresponding voltage.

18. An optical sensor comprising:
an optical digital sensor chip assembly (SCA), the SCA comprising a focal plane array (FPA) and a digital read out integrated circuit (DROIC);
wherein the FPA comprises an array of photovoltaic diodes that converts light photons to photocurrent,
wherein the DROIC comprises a plurality of unit cells located directly adjacent to a side of the FPA that is located opposite a side of the FPA that contacts the light photons,
wherein the plurality of unit cells integrate and convert the photocurrent in each pixel of the array of photovoltaic diodes to a corresponding voltage, and
wherein the plurality of unit cells further comprises a plurality of switching circuitry and a plurality of memory enabling temporal detection and signal-to-noise ratio (SNR) oversampling.

19. The optical sensor of claim 18, wherein the DROIC further comprises a plurality of analog-to-digital converters (ADC) located in a sidecar configuration at a position adjacent to a matching array of charge-to-voltage integrating amplifiers for the conversion of the photocurrent to a digital output stream, a buffered direct integration (BDI) current integrator, a variable gain block with four commandable values, a multiplexer voltage amplifier for gain correction and SNR enhancement for the plurality of unit cells, and an analog-to-digital converter to enable variable bit depth.

20. An optical sensor comprising:
an optical digital sensor chip assembly (SCA), the SCA comprising a focal plane array (FPA) and a digital read out integrated circuit (DROIC);
wherein the FPA comprises an array of photovoltaic diodes that converts light photons to photocurrent,
wherein the DROIC comprises a plurality of unit cells located directly adjacent to a side of the FPA that is located opposite a side of the FPA that contacts the light photons,
wherein the plurality of unit cells integrate and convert the photocurrent in each pixel of the array of photovoltaic diodes to a corresponding voltage, and
wherein the DROIC is configured to report temporal changes for each pixel, wherein the temporal changes comprise an increase, no change, or a decrease.

21. An optical sensor comprising:
an optical digital sensor chip assembly (SCA), the SCA comprising a focal plane array (FPA) and a digital read out integrated circuit (DROIC);
wherein the FPA comprises an array of photovoltaic diodes that converts light photons to photocurrent,
wherein the DROIC comprises a plurality of unit cells located directly adjacent to a side of the FPA that is located opposite a side of the FPA that contacts the light photons,
wherein the plurality of unit cells integrate and convert the photocurrent in each pixel of the array of photovoltaic diodes to a corresponding voltage, and
wherein the DROIC is configured to perform pixel-level auto-detection comprising pixel-level temporal detection and pixel-level detection of changes in intensity.

22. An optical sensor comprising:
an optical digital sensor chip assembly (SCA), the SCA comprising a focal plane array (FPA) and a digital read out integrated circuit (DROIC);
wherein the FPA comprises an array of photovoltaic diodes that converts light photons to photocurrent,
wherein the DROIC comprises a plurality of unit cells located directly adjacent to a side of the FPA that is located opposite a side of the FPA that contacts the light photons,
wherein the plurality of unit cells integrate and convert the photocurrent in each pixel of the array of photovoltaic diodes to a corresponding voltage, and
wherein the DROIC is configured to stamp, with metadata, each data frame sensed by the optical sensor.

23. The optical sensor of claim 22, wherein the metadata is selected from the group consisting of: operating mode, integration time, frame number, and combinations thereof.

24. An optical sensor comprising:
an optical digital sensor chip assembly (SCA), the SCA comprising a focal plane array (FPA) and a digital read out integrated circuit (DROIC);
wherein the FPA comprises an array of photovoltaic diodes that converts light photons to photocurrent,
wherein the DROIC comprises a plurality of unit cells located directly adjacent to a side of the FPA that is located opposite a side of the FPA that contacts the light photons,
wherein the plurality of unit cells integrate and convert the photocurrent in each pixel of the array of photovoltaic diodes to a corresponding voltage, and
wherein the plurality of unit cells comprise a plurality of capacitors that permit a pixel well depth of between 250,000 and 8,500,000 electrons.

25. An optical sensor comprising:
an optical digital sensor chip assembly (SCA), the SCA comprising a focal plane array (FPA) and a digital read out integrated circuit (DROIC);
wherein the FPA comprises an array of photovoltaic diodes that converts light photons to photocurrent,
wherein the DROIC comprises a plurality of unit cells located directly adjacent to a side of the FPA that is located opposite a side of the FPA that contacts the light photons,
wherein the plurality of unit cells integrate and convert the photocurrent in each pixel of the array of photovoltaic diodes to a corresponding voltage, and
wherein the DROIC utilizes at least 1,000 registers, and wherein the optical sensor switches between register settings by writing a single 8-bit word to a command buss.

26. The optical sensor of claim 25, wherein the DROIC contains a plurality of default memory pages, wherein each page in the plurality of default memory pages contains pre-populated register settings required for each mode of operation of the optical sensor.

27. The optical sensor of claim 26, wherein each of the plurality of default memory pages is turned with the single 8-bit word.

28. An optical sensor comprising:
an optical digital sensor chip assembly (SCA), the SCA comprising a focal plane array (FPA) and a digital read out integrated circuit (DROIC);
wherein the FPA comprises an array of photovoltaic diodes that converts light photons to electronic charges, wherein the DROIC receives the electronic charges and converts the electronic charges to a digital output stream, wherein the DROIC comprises:
- a plurality of circuitry, the plurality of circuitry comprising a plurality of unit cells located adjacent to a side of the array of photovoltaic diodes that is located opposite a side of the array of photovoltaic diodes that contacts the light photons, and a plurality of analog-to-digital converters (ADC) arranged at a distance from, and adjacent to, a matching array of charge-to-voltage integrating amplifiers for the conversion of the electronic charges to the digital output stream,
- a buffered direct integration (BDI) current integrator,
- a variable gain block with four commandable values,
- a multiplexer voltage amplifier for gain correction and SNR enhancement for the plurality of unit cells, and
- an analog-to-digital converter to enable variable bit depth, wherein each diode in the array of photovoltaic diodes is mated to a unit cell in the plurality of unit cells, and wherein the SNR enhancement comprises in-unit cell over-sampling and minimization of unit cell integrator reset time.

* * * * *